US008568822B2

(12) United States Patent
Lam

(10) Patent No.: US 8,568,822 B2
(45) Date of Patent: Oct. 29, 2013

(54) APPARATUS AND METHOD INCORPORATING DISCRETE PASSIVE COMPONENTS IN AN ELECTRONIC PACKAGE

(75) Inventor: Ken M. Lam, Colorado Springs, CO (US)

(73) Assignee: Atmel Corporation, San Jose, CA (US)

( * ) Notice: Subject to any disclaimer, the term of this patent is extended or adjusted under 35 U.S.C. 154(b) by 786 days.

(21) Appl. No.: 11/951,654

(22) Filed: Dec. 6, 2007

(65) Prior Publication Data

US 2008/0075841 A1    Mar. 27, 2008

Related U.S. Application Data

(62) Division of application No. 11/305,462, filed on Dec. 16, 2005, now Pat. No. 7,327,030.

(51) Int. Cl.
*B05D 5/00* (2006.01)

(52) U.S. Cl.
USPC .............................. 427/58; 427/97.1; 427/259

(58) Field of Classification Search
USPC .......... 174/260, 261; 257/676; 428/40.1, 434, 428/411.1; 165/60
See application file for complete search history.

(56) References Cited

U.S. PATENT DOCUMENTS

| | | | | |
|---|---|---|---|---|
| 5,122,929 A | * | 6/1992 | Palanisamy et al. | 361/760 |
| 5,192,835 A | * | 3/1993 | Bull et al. | 174/260 |
| 5,606,195 A | * | 2/1997 | Hooper et al. | 257/488 |
| 6,335,564 B1 | * | 1/2002 | Pour | 257/666 |
| 6,344,125 B1 | * | 2/2002 | Locke et al. | 205/118 |
| 6,388,200 B2 | * | 5/2002 | Schaper | 174/255 |
| 6,742,248 B2 | * | 6/2004 | Wong et al. | 29/840 |
| 6,757,181 B1 | * | 6/2004 | Villanueva et al. | 361/816 |
| 7,245,011 B2 | | 7/2007 | Liu | |
| 7,327,030 B2 | | 2/2008 | Lam | |
| 2002/0041019 A1 | * | 4/2002 | Gang | 257/678 |
| 2004/0183209 A1 | | 9/2004 | Lin | |
| 2005/0017361 A1 | | 1/2005 | Lin et al. | |
| 2005/0064625 A1 | | 3/2005 | Huang | |
| 2005/0230812 A1 | | 10/2005 | Przadka | |
| 2006/0131616 A1 | * | 6/2006 | Devaney et al. | 257/226 |

FOREIGN PATENT DOCUMENTS

JP    3-231450    10/1991

OTHER PUBLICATIONS

"U.S. Appl. No. 11/305,462, Non-Final Office Action mailed Aug. 7, 2007", 6 pgs.
"U.S. Appl. No. 11/305,462, Notice of Allowance mailed Nov. 28, 2007", 5 pgs.
"U.S. Appl. No. 11/305,462, Response filed Nov. 7, 2007 to Non-Final Office Action mailed Aug. 7, 2007", 11 pgs.

\* cited by examiner

*Primary Examiner* — Michael Cleveland
*Assistant Examiner* — Tabassom Tadayyon Eslami
(74) *Attorney, Agent, or Firm* — Fish & Richardson P.C.

(57) ABSTRACT

An apparatus and method for incorporating discrete passive components into an integrated circuit package. A metal layer is formed over a surface of a substrate. A layer of photosensitive material is then formed over the metal layer. Using standard photolithographic processing, a pattern is formed with the photosensitive material to expose at least one region of the metal layer. The remaining photosensitive material protects the underlying metal during metal etching. The substrate is then subjected to a metal etching process to remove the metal that is not protected by the photosensitive material. The remaining photosensitive material is then removed from each remaining area of the metal layer. The discrete passive components can then be attached to the formed metal lands.

12 Claims, 3 Drawing Sheets

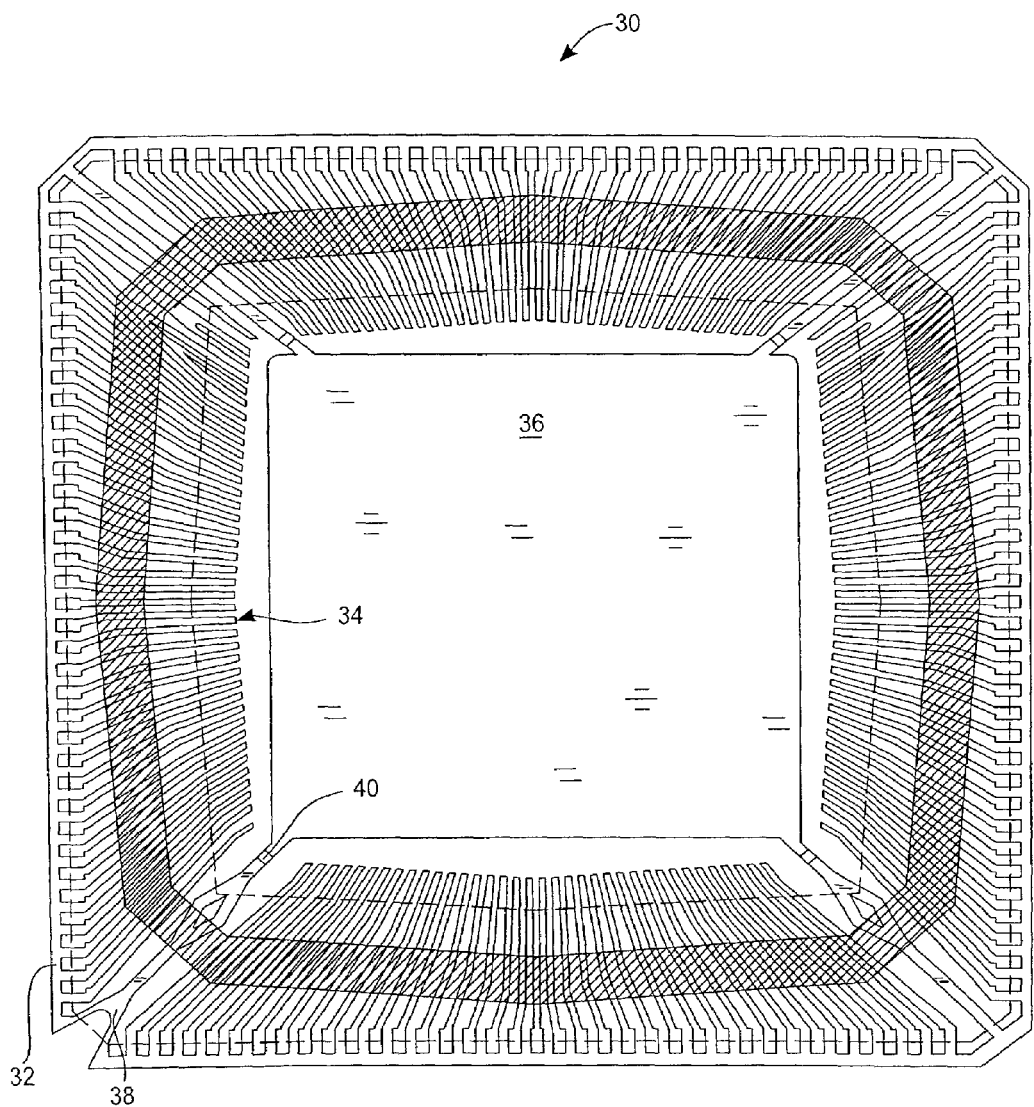
Fig._1 (Prior Art)

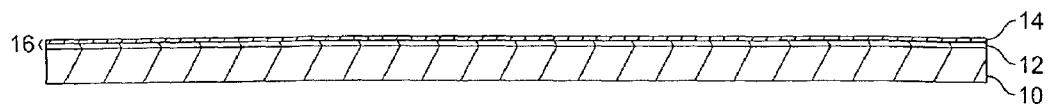
*Fig._ 2a*
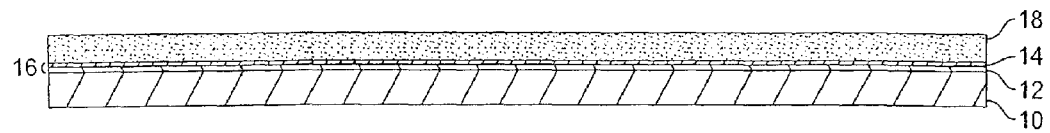
*Fig._ 2b*
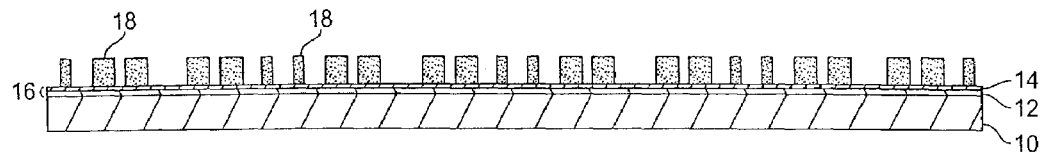
*Fig._ 2c*
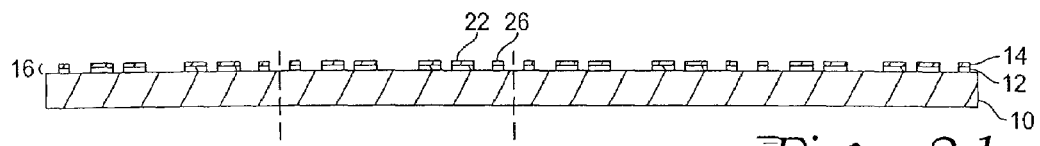
*Fig._ 2d*
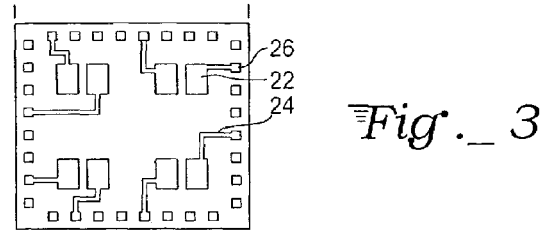
*Fig._ 3*
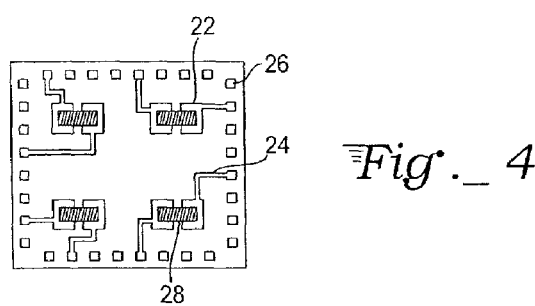
*Fig._ 4*

APPARATUS AND METHOD INCORPORATING DISCRETE PASSIVE COMPONENTS IN AN ELECTRONIC PACKAGE

CROSS-REFERENCE TO RELATED APPLICATION

This is a divisional of application Ser. No. 11/305,462 now U.S. Pat. No. 7,327,030, filed Dec. 16, 2005.

FIELD OF THE INVENTION

This invention is directed to electronic packages, particularly electronic packages which incorporate discrete passive components.

BACKGROUND

A leadframe is the metal frame a semiconductor is attached to during the package assembly process. In FIG. 1, an exemplary prior art leadframe 30 includes a die pad 36 on which a chip, or die, is eventually mounted. The corners of die pad 36 are attached to the leadframe's internal frame, or dam bar, 32, which supports the die pad 36. A plurality of leads 34 is also supported by the dam bar 32. The corners of the die pad 36 are connected to the dam bar 32 by a tie bar 38. The tie bars 38 have a down-set 40 so that die pad 36 is below the leads 34.

Discrete passive components, such as capacitors or inductors, currently are incorporated into electronic packages, such as integrated circuit ("IC") packages, by attaching them to the substrate or leadframe of the packages. This causes the package size to increase, going against the trend of package minimization or miniaturization. A custom-designed leadframe for passive attachment is also required. The number of passive components, their size, and signal pair locations are also restricted using this approach.

When discrete passive components are attached onto leadframes with solder or conductive epoxy, the location of these components is very restricted. The land features for the attachment of these components are designed on the leads. The lead pitch (the distance from a centerline of one lead to a centerline of an adjacent lead) is often smaller than the size of the passive component and the component's possible locations are typically limited to the corner fan-out areas of the leadframe. Also, due to the "no-crossing" nature of leadframes, the land features are limited to adjacent pairs of leads. Since the size of the land features for attaching discrete passive components is limited by the spacing available on the leadframe, the physical size and location of the discrete passive components are also limited.

The attachment of wirebondable discrete passive components onto leadframes or the die is also problematic. Bond pads on the die are typically designed to accept one wirebond. However, to support wirebondable passive components, the bond pad has to be able to accept at least 2 bonds (one bond from the passive component to the bond pad, another bond to connect the bondpad to the package lead). In addition, there is a very limited supply source for wirebondable discrete passive components since not all passive components are available in wirebondable configuration; those that are available tend to have a high unit cost.

An additional problem is that the aluminum pads, to which components are often connected, offer limited connection options. Aluminum metal is not solderable and conductive epoxy cannot be used to attach discrete components to aluminum due to resultant high contact resistance. Typical aluminum wirebond pads are too small and too close together for attachment of even the smallest-sized discrete component.

Therefore, it would be advantageous to improve the manner in which discrete passive components are incorporated into electronic packages.

SUMMARY

In one embodiment, a method of fabrication comprises forming a metal layer over a surface of a semiconductor substrate. A layer of photosensitive material is then formed over the metal layer. A pattern is formed with the photosensitive material to expose at least one region of the metal layer. Then at least one region of the exposed metal layer is etch removed using the exposed pattern of photosensitive material as a mask. The remaining photosensitive material is then removed from each remaining area of the metal layer.

In another embodiment, a method of fabrication comprises forming a dielectric insulation layer over a passivation layer of a semiconductor substrate. A metal layer is then formed over the dielectric insulation layer. A layer of photosensitive material is formed over the metal layer. A pattern is formed with the photosensitive material to expose at least one region of the metal layer. Then at least one exposed region of the metal layer is etch removed using the exposed pattern of photosensitive material as a mask. The remaining photosensitive material is removed from each remaining area of the metal layer.

In one embodiment, a device comprises a semiconductor substrate, a plurality of first structures, and a plurality of second structures. Each of the plurality of first structures is configured to have an electronic component attached. At least one of each of the plurality of second structures is coupled to at least one of each of the plurality of first structures as indicated by a designated configuration of the device. The device is configured to be attached to a leadframe.

BRIEF DESCRIPTION OF THE DRAWINGS

FIG. 1 is a leadframe in the prior art.

FIGS. 2a-2d are diagrams showing stages of fabrication in an embodiment of the invention.

FIG. 3 is a view of a singulated die fabricated in accordance with the steps shown in FIGS. 2a-2d.

FIG. 4 is an IC die fabricated in accordance with an embodiment of the invention.

DETAILED DESCRIPTION

Figure 5A:
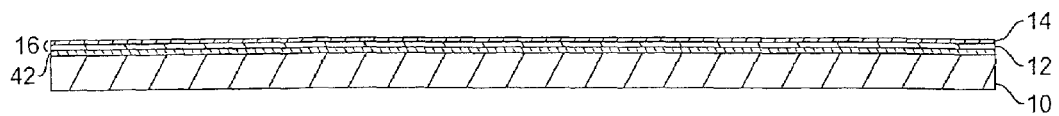
FIGS. 5a-5d are diagrams showing stages of fabrication in another embodiment of the invention.

In FIG. 2a, a surface of semiconductor substrate 10, or product wafer, which may form the IC die of a package is blanket metallized with a metal layer 16. The wafer may be made of any suitable semiconductor material, such as silicon or gallium arsenide, used in the art. Any substrate, such as silicon or an insulator, or semiconductor substrate, such as a product wafer, may be used in various embodiments. The surface of the substrate may be a passivation layer. The metal layer 16 can be a single metal layer or may be formed from a combination of different metal layers. The metal layer or combination of metal layers has the functions of providing adhesion to the wafer's top passivation layer and bond pad metal, diffusion barrier, solder-wettable surface and/or wirebondable surface. Examples of metals which may be used include titanium tungsten-gold (TiW—Au), titanium-gold (Ti—Au), chromium-gold (Cr—Au), titanium tungstennickel-gold (TiW—Ni—Au), titanium-nickel-gold (Ti—Ni—Au), titanium-copper-nickel-gold (Ti—Cu—Ni—Au), titanium tungstun-copper-nickel-silver (TiW—Cu—Ni—Ag), etc. With regard to the metal layer 16, a combination of metal deposition processes, such as sputtering and plating, may be employed to increase the layer's 16 current carrying capacity for certain applications. The metal layer 16 provides adhesion to the product wafer's top passivation layer (not shown), current carrying capacity, and low contact resistance attach lands for the discrete passive component which will be attached to the lands. In other embodiments, the metal layer 16 may also form attach lands which are wirebondable or solderable (e.g., have a solder wettable metal such as Au, copper (Cu), silver (Ag), and/or have a diffusion barrier (e.g., nickel (Ni)). In the exemplary embodiment pictured in FIG. 2a, the metal layer 16 consists of TiW 12 and Au 14; the metal deposition process used is sputtering and the layers are deposited by the same tool without breaking the vacuum. The TiW layer 12 provides good adhesion to the wafer's top passivation layer and the Au layer 14 provides a non-oxidizing surface and a low contact resistance surface for the discrete passive component to be attached. Au is also wirebondable; therefore, the IC die's wirebond pads will remain wirebondable after the wafer is patterned (discussed below).

In FIG. 2b, a layer of photosensitive material 18, such as photoresist, is applied over the metal layer. This layer can be from 5000 Å to 5 microns thick. The photoresist 18 is patterned and developed using methods well-known to those of ordinary skill in the art. In FIG. 2c, the masked photoresist has been exposed and developed away using methods well-known to those of skill in the art. The remaining photoresist 18 masks those areas of the metal layer 16 which will form attach lands and wirebond pads.

The exposed metal layer 16 is then etched away and the remaining photoresist 18 stripped using methods well-known to those of skill in the art. (This can be achieved with dry etching or wet etching processes.) In FIG. 2d, the remaining areas of the metal layer 16 correspond to the attach lands 22 and wirebond pads 26. With reference to FIG. 3, a plan view of a section of the die corresponding to a singulated IC die of the die pad shows the attach lands 22 connected to wirebond pads 26 with a lead 24.

In FIG. 4, the discrete passive component 28 is attached to the lands 22. A lead 24 connects the land 22 and the discrete passive component 28 to the wirebond pad 26. In this embodiment, the component 28 is attached to the lands 22 with conductive epoxy. In other embodiments, the component may be attached using another method, such as soldering.

In other embodiments, the blanket metal layer can function as a seed metal layer for pattern plating to increase the metal thickness. The excess seed metal layer can be etch removed after pattern plating.

In FIG. 5a, in another embodiment, a dielectric insulation layer 42 can be applied to the semiconductor substrate 10 before the metal layer 16 is formed. The insulation layer 42 may be polyamide, benzocyclobutene (BCB), etc. The typical thickness is 2 to 10 microns. This layer 42 is typically applied by a spin-coating process. The insulation layer 42 reduces noise, cross talk, and signal interference between the attached discrete passive components and the circuit in the IC die.

Figure 5B:
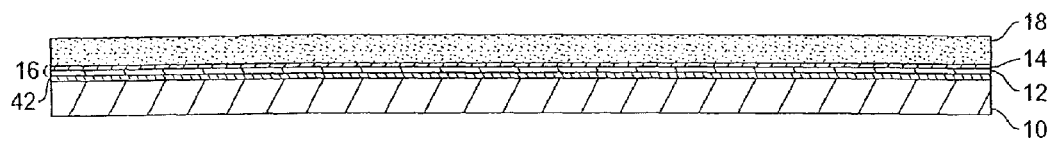
Figure 5C:
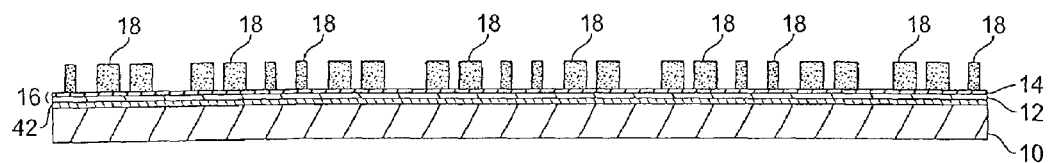
Figure 5D:
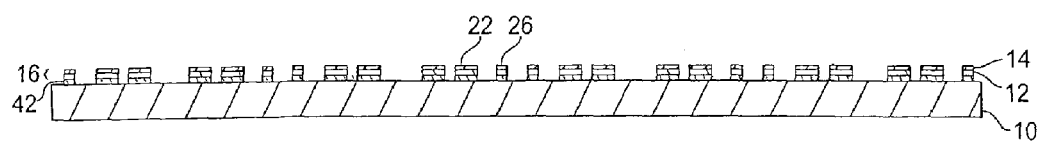

With reference to FIG. 5b, a layer of photoresist 18 is then formed over the metal layer, as discussed above in FIG. 2b. In FIGS. 5c and 5d, the photoresist 18 is patterned, developed, and the underlying metal layer 16 is etch removed as discussed with reference to FIGS. 2c and 2d. In FIG. 5d, as an optional step depending on the application, the areas of the insulation layer 42, exposed after the metal layer 16 is removed, are also removed by methods well-known to those of skill in the art. This can be achieved with dry etching or wet etching processes.

The approaches discussed above provide additional surface area (i.e., the die top) for mounting discrete passive components in electronic packages such as molded leadframe packages, BGAs, LGAs, etc. The semiconductor device, or IC, produced using the approaches discussed above has a plurality of structures, i.e., attach lands and bond pads, and is configured to be incorporated into a leadframe package. In some embodiments, the bond pads are able to accept at least two bonds (for instance, one bond from the component to the bond pad and another bond connecting the bond pad to the package lead. Lands, or pads, may be connected randomly over the device or IC and the bond pads do not have to be adjacent to the lands. In addition, packages with discrete passive components no longer require custom-designed leadframes in order to incorporate the discrete passive components. Another advantage of the approach discussed above is that the discrete passive components can be attached at the wafer level prior to wafer dicing rather than individually attaching the passive components after die attach in assembly at the package level.

While the preceding description has described specific embodiments, it will be evident to a skilled artisan that various changes and modifications can be made to these embodiments. For example, metal or conductive layers other than those described and shown may be used (e.g., platinum, tantalum, etc.). Further, a skilled artisan will recognize that such conductive layers may be deposited or formed by methods and techniques other than those described herein (e.g., copper may be formed by a dual damascene technique know to those of skill in the art). The specification and drawings, therefore, are to be regarded in an illustrative rather than a restrictive sense.

What is claimed is:

1. A method of fabrication comprising;

forming a dielectric insulation layer over a passivation layer formed on a surface of a substrate having circuitry formed therein;

forming a metal layer over the dielectric insulation layer;

forming a layer of photosensitive material over the metal layer;

forming a pattern with the photosensitive material to expose at least one region of the metal layer;

removing the at least one exposed region of the metal layer using the pattern of photosensitive material as a mask, the removal of the at least one exposed region of the metal layer exposing at least one region of the dielectric insulation layer;

removing the at least one exposed region of the dielectric insulation layer; and removing remaining photosensitive material from each remaining area of the metal layer for forming a structure to which a leadframe of an electronic package and an electronic component may be attached, wherein forming the structure comprises forming a bond pad to accept at least two bonds including a first bond to couple the structure to the electronic component and a second bond to couple the structure to a package lead of the leadframe of the electronic package, wherein the package lead is not formed over a surface of the substrate.

2. The method of claim 1 further comprising:

attaching the electronic component to the structure through the first bond, the electronic component comprising a discrete passive component; and coupling the structure to the package lead through the second bond.

3. The method of claim 2 wherein the discrete passive component is soldered to the structure.

4. The method of claim 2 wherein the discrete passive component is wirebonded to the structure.

5. The method of claim 2 wherein the discrete passive component is attached with conductive epoxy.

6. The method of claim 1 wherein the surface of the substrate is a passivation layer.

7. The method of claim 1 wherein the metal layer is a multi-layer of different metals.

8. The method of claim 1 wherein the metal layer is formed of titanium tungsten and gold.

9. The method of claim 1 wherein the metal layer is a blanket metal layer.

10. The method of claim 9 wherein the blanket metal layer is a seed layer for pattern plating.

11. The method of claim 1 further comprising attaching a wirebond to the structure.

12. The method of claim 1 wherein the substrate is an integrated circuit die.

* * * * *